(12) United States Patent
Ponoth et al.

(10) Patent No.: US 7,928,570 B2
(45) Date of Patent: Apr. 19, 2011

(54) INTERCONNECT STRUCTURE

(75) Inventors: Shom Ponoth, Clifton Park, NY (US); David V. Horak, Essex Junction, VT (US); Takeshi Nogami, Schenectady, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/424,843

(22) Filed: Apr. 16, 2009

(65) Prior Publication Data

US 2010/0264543 A1 Oct. 21, 2010

(51) Int. Cl.
*H01L 23/48* (2006.01)
*H01L 21/768* (2006.01)
*H01L 23/538* (2006.01)

(52) U.S. Cl. ........... 257/751; 257/E23.145; 257/E23.16; 257/E23.167; 257/762; 257/680; 257/773; 257/774

(58) Field of Classification Search .................. 257/751, 257/762, E23.145, E23.16, E23.167, 680, 257/773, 774
See application file for complete search history.

(56) References Cited

U.S. PATENT DOCUMENTS

| 6,083,842 | A | 7/2000 | Cheung et al. | |
|---|---|---|---|---|
| 7,064,064 | B2 | 6/2006 | Chen et al. | |
| 7,259,463 | B2 | 8/2007 | Huang et al. | |
| 2004/0238963 | A1* | 12/2004 | Fujisawa | 257/758 |
| 2007/0275557 | A1* | 11/2007 | Yang et al. | 438/643 |
| 2008/0012142 | A1 | 1/2008 | Mehta et al. | |
| 2008/0042283 | A1* | 2/2008 | Purushothaman et al. | 257/754 |
| 2008/0122112 | A1* | 5/2008 | Ogawa | 257/774 |
| 2008/0194102 | A1* | 8/2008 | Usami et al. | 438/653 |
| 2008/0260940 | A1* | 10/2008 | Yoon et al. | 427/96.2 |
| 2009/0155996 | A1* | 6/2009 | Yang et al. | 438/638 |
| 2009/0209099 | A1* | 8/2009 | Yu et al. | 438/653 |
| 2010/0013100 | A1* | 1/2010 | Xiao et al. | 257/751 |
| 2010/0148366 | A1* | 6/2010 | Yang et al. | 257/751 |

* cited by examiner

*Primary Examiner* — Alexander O Williams
(74) *Attorney, Agent, or Firm* — Katherine S. Brown; Hoffman Warnick LLC

(57) ABSTRACT

An interconnect structure is disclosed. In one embodiment, the interconnect structure includes: a substrate including a first liner layer and a first metal layer thereover; a dielectric barrier layer over the first metal layer and the substrate; an inter-level dielectric layer over the dielectric barrier layer; a via extending between the inter-level dielectric layer, the dielectric barrier layer, and the first metal layer, the via including a second liner layer and a second metal layer thereover; and a diffusion barrier layer located between the second liner layer and the first metal layer, wherein a portion of the diffusion barrier layer is located under the dielectric barrier layer.

6 Claims, 4 Drawing Sheets

INTERCONNECT STRUCTURE

CROSS-REFERENCE TO RELATED APPLICATIONS

The current application is related in some aspects to co-pending United States patent application Ser. No. 11/307,642, with corresponding publication No. US 2008/0012142A1 (filed on Feb. 15, 2006), which is hereby incorporated by reference.

BACKGROUND OF THE INVENTION

The subject matter disclosed herein relates to a semiconductor interconnect structure and methods of forming the same.

BRIEF DESCRIPTION OF THE INVENTION

An interconnect structure and methods for forming semiconductor interconnect structures are disclosed. In one embodiment, the interconnect structure includes: a substrate including a first liner layer and a first metal layer thereover; a dielectric barrier layer over the first metal layer and the substrate; an inter-level dielectric layer over the dielectric barrier layer; a via extending between the inter-level dielectric layer, the dielectric barrier layer, and the first metal layer, the via including a second liner layer and a second metal layer thereover; and a diffusion barrier layer located between the second liner layer and the first metal layer, wherein a portion of the diffusion barrier layer is located under the dielectric barrier layer.

A first aspect of the disclosure provides an interconnect structure comprising: a substrate including a first liner layer and a first metal layer thereover; a dielectric barrier layer over the first metal layer and the substrate; an inter-level dielectric layer over the dielectric barrier layer; a via extending between the inter-level dielectric layer, the dielectric barrier layer, and the first metal layer, the via including a second liner layer and a second metal layer thereover; and a diffusion barrier layer located between the second liner layer and the first metal layer, wherein a portion of the diffusion barrier layer is located under the dielectric barrier layer.

A second aspect of the disclosure provides a method comprising: a method comprising: forming a via opening in both a dielectric barrier layer and an inter-level dielectric layer over the dielectric barrier layer; forming a recess in a first metal layer located below the dielectric barrier layer; selectively depositing a diffusion barrier layer in the recess; forming a liner layer over the diffusion barrier layer, the dielectric barrier layer, and the inter-level dielectric layer; and forming a second metal layer over the liner layer.

A third aspect of the disclosure provides a method of forming an interconnect structure using a dual damascene process, the method comprising: forming a first trench in a substrate; forming a liner layer within the trench; forming a first metal layer over the liner layer; forming a dielectric barrier layer over the substrate, the liner layer, and the first metal layer; forming an inter-level dielectric layer over the dielectric barrier layer; forming a via opening and a second trench in the inter-level dielectric layer, the via opening extending between the first metal layer, the dielectric barrier layer, and the substrate; forming a diffusion barrier layer within the via opening, the diffusion barrier layer located over the first metal layer; forming a via liner layer over the diffusion barrier layer, the dielectric barrier layer and the inter-level dielectric layer; and forming a second metal layer over the via liner layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
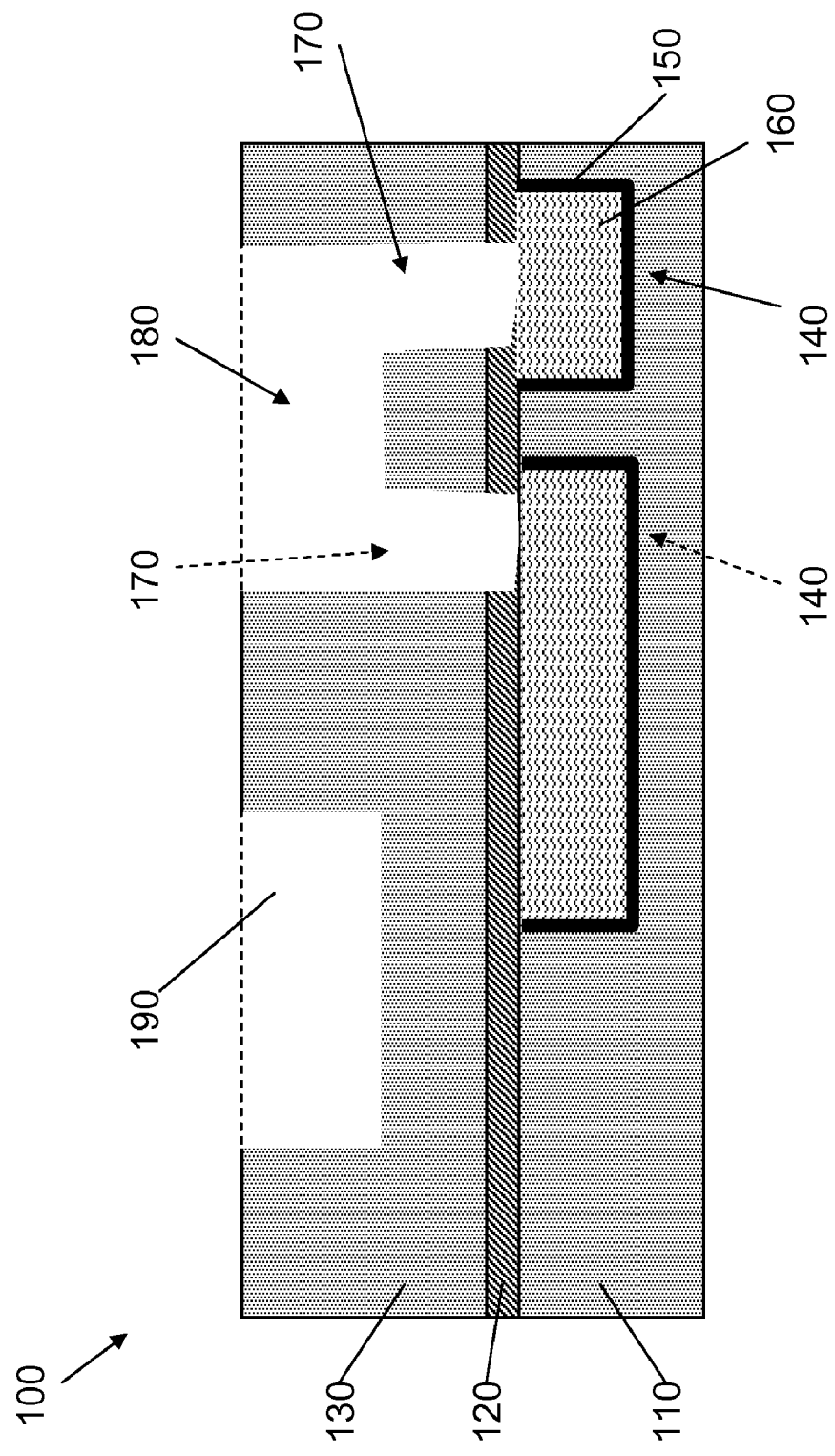
FIGS. 1-4 show cross-sectional views of processing steps in forming an interconnect structure of an embodiment of the invention.

Turning to the drawings, FIG. 1 shows an interconnect structure 100 which may include a substrate 110, a dielectric barrier layer 120 over substrate 110, and an inter-level dielectric layer 130 over dielectric barrier layer 120. Various methods may be employed to create interconnect structure 100, however, one conventional method may include providing substrate 110 including first trench 140. First trench 140 may be formed using any conventional techniques known in integrated circuit fabrication. Optionally, an additional trench 140 (shown in phantom) may be formed in substrate 110, using similar techniques to forming of first trench 140. Further, the method may include depositing a first liner layer 150 within first trenches 140 and depositing a first metal layer 160 over first liner layer 150. First metal layer 160 may be formed of, for example, copper and/or copper alloys such as CuAl and CuMn. The method may further include providing dielectric barrier layer 120 over substrate 110, first liner layer 150 and first metal layer 160. Dielectric barrier layer 120 may be deposited using conventional techniques described herein and/or those known in the art. Additionally, the method may include forming inter-level dielectric layer 130 over dielectric barrier layer 120. As with dielectric barrier layer 120, inter-level dielectric layer 130 may be deposited using conventional techniques described herein and/or those known in the art. Further, this method may include forming a via opening 170 and a second trench 180. Via opening 170 and second trench 180 may be formed, for example, using conventional dual damascene techniques, or those detailed in co-pending United States patent application number US 2008/0012142A1 and U.S. Pat. No. 7,064,064. For example, via opening 170 and second trench 180 may be formed by reactive ion etching (RIE). Optionally, additional via opening 170 may be formed (shown in phantom) using similar techniques to forming of via opening 170. Also, optional inter-level trench 190 may be formed in inter-level dielectric layer 130 according to conventional techniques and/or those described herein.

Figure 2:
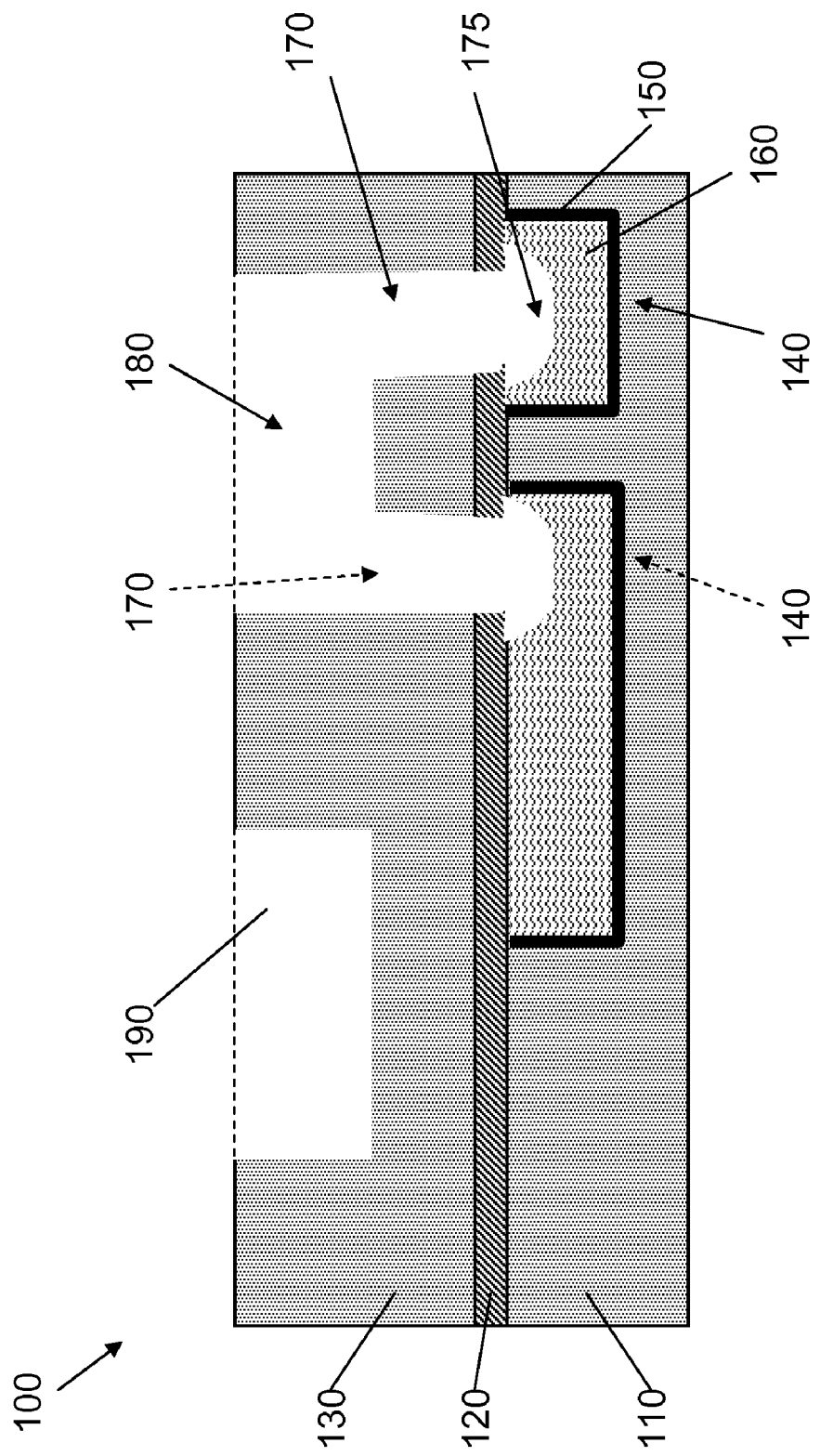

Turning to FIG. 2, interconnect structure 100 of FIG. 1 is shown after formation of a recess 175 in first metal layer 160 located below dielectric barrier layer 120. Recess 175 may be formed, for example, using a chemical recess etch of first metal layer 160. In the case where first metal layer 160 includes copper, the chemical recess etch may be any etching technique capable of forming recess 175 in copper.

Figure 3:
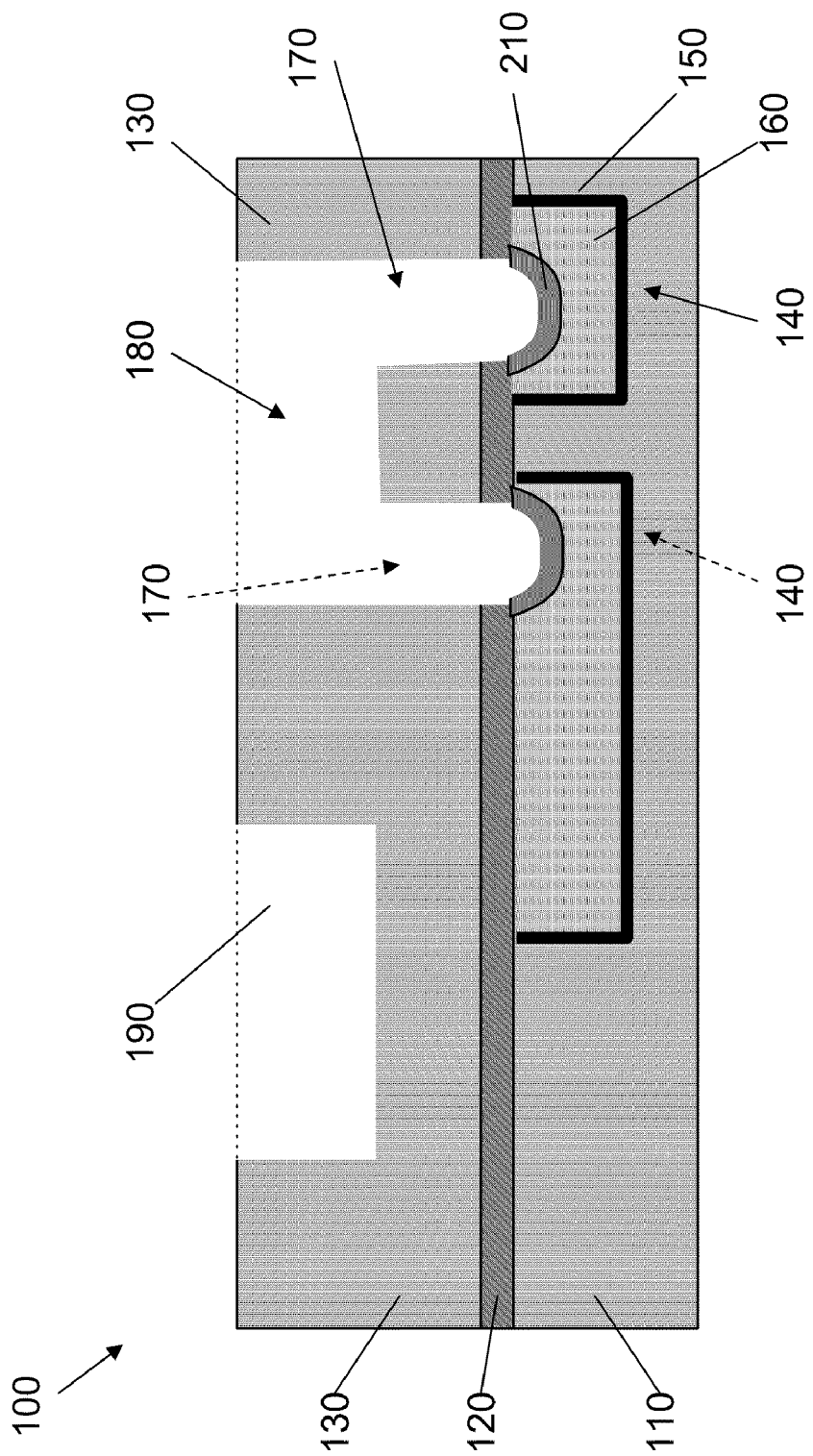

Turning to FIG. 3, interconnect structure 100 of FIG. 2 is shown after forming of a diffusion barrier layer 210 within recess 175. Diffusion barrier layer 210 may be deposited after the chemical recess etch of first metal layer 160, described with reference to FIG. 2. Diffusion barrier layer 210 may be formed over first metal layer 160. In one embodiment, diffusion barrier layer 210 may be selectively deposited over first metal layer 160. Diffusion barrier layer 210 may be formed of, for example, cobalt tungsten-phosphide (CoWP), cobalt tungsten-boride (CoWB), or ruthenium (Ru). However, diffusion barrier layer 210 may be formed of any metal capable of preventing or retarding (slowing down) copper diffusion. Using CoWP, CoWB, or Ru as diffusion barrier layer 210 may allow for depositing of diffusion barrier layer 210 only over exposed portions of first metal layer 160. As shown in FIG. 3, recess 175 is located below dielectric barrier layer 120, causing a portion of diffusion barrier layer 210 to be located below dielectric barrier layer 120. In one embodiment, diffusion barrier layer 210 may be entirely located below dielectric barrier layer 120. In any case, diffusion barrier layer 210 prevents or retards exposure of first metal layer 160 to via opening 170.

Figure 4:
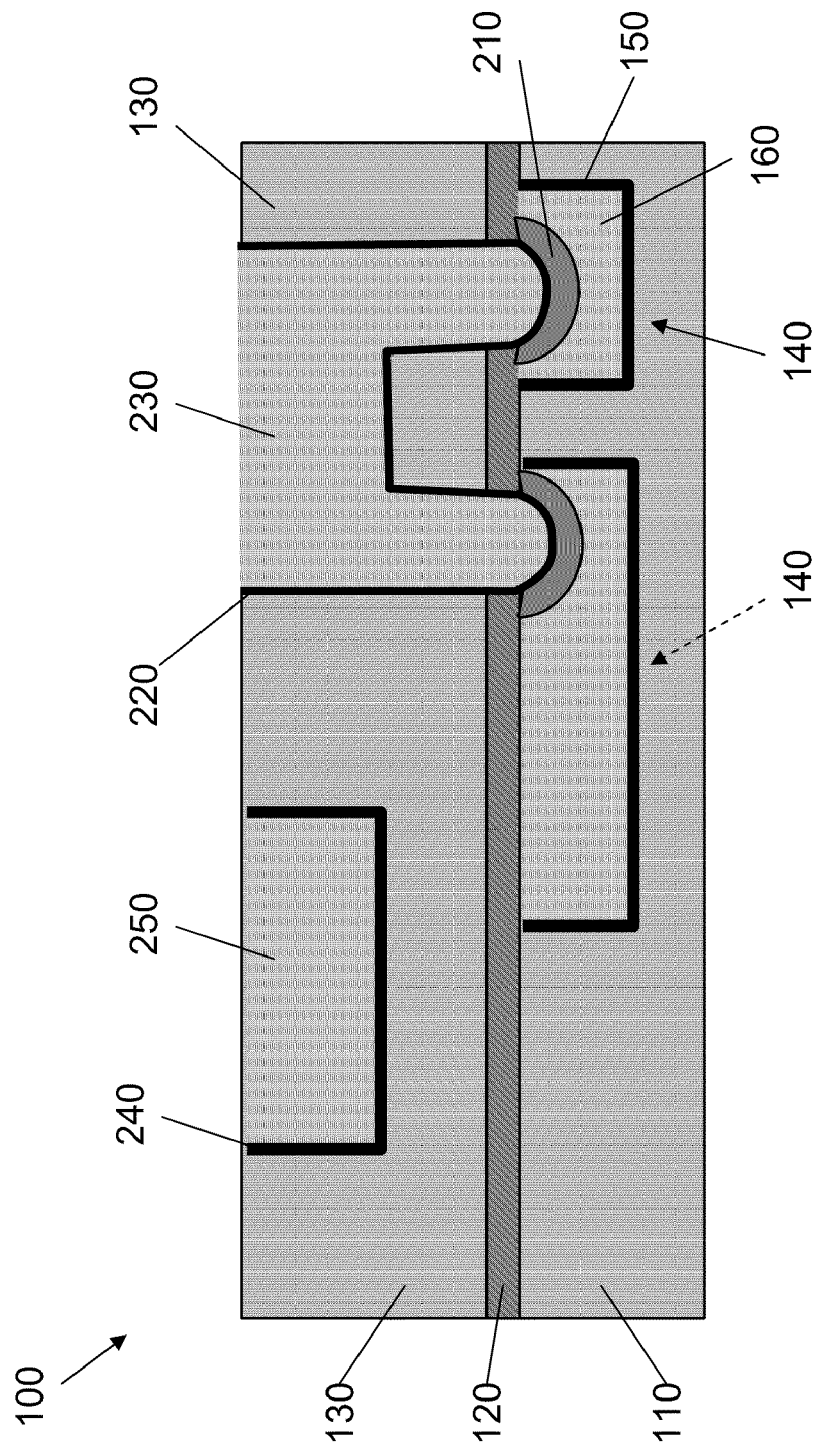

Turning to FIG. 4, interconnect structure 100 of FIG. 3 is shown after forming of a second liner layer 220 and second metal layer 230. After forming of diffusion barrier layer 210, second liner layer 220 may be formed over diffusion barrier layer 210, dielectric barrier layer 120 and inter-level dielectric layer 130. Second liner layer 220 may be formed of, for example, tantalum nitride (TaN), tantalum (Ta), and/or ruthenium (Ru). However, second liner layer 220 may be formed of other materials that are thermodynamically stable with copper (Cu). Second liner layer 220 may be deposited using, for example, chemical vapor deposition (CVD) or other conventional methods. After deposition of second liner layer 220, second metal layer 230 may be formed over second liner layer 220. Second metal layer 230 may be formed of, for example copper. However, second metal layer 230 may also be formed of other electrically conductive materials conventionally used in integrated circuits. In one embodiment, second metal layer 230 may be formed of copper, and may be deposited via dual damascene metallization over second liner layer 220, thereby filling via opening 170 and second trench 180 (FIG. 2). In this case, second metal layer 230 may be deposited by electrodeposition in via opening 170 and second trench 180, thereby requiring removal of an undesired portion of second metal layer 230. This may be accomplished, for example, by depositing a thin film (plating) and using chemical mechanical planarization (CMP) to remove the undesired portion of second metal layer 230. Plating and CMP may be performed in any conventional manner used in integrated circuit fabrication. Also shown in FIG. 3 are third liner layer 240 and third metal layer 250 formed within inter-level trench 190. Third liner layer 240 and third metal layer 250 may be formed of substantially similar materials as second liner layer 220 and second metal layer 230, and may be formed in a similar fashion. Further, third liner layer 240 and second liner layer 220 may be formed substantially simultaneously, while third metal layer 250 and second metal layer 230 may be formed substantially simultaneously.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

The invention claimed is:

1. An interconnect structure comprising:
   a substrate including a first liner layer and a first metal layer thereover;
   a dielectric barrier layer over the first metal layer and the substrate;
   an inter-level dielectric layer over the dielectric barrier layer;
   a via extending between the inter-level dielectric layer, the dielectric barrier layer, and the first metal layer, the via including a second liner layer and a second metal layer thereover; and
   a diffusion barrier layer located between the second liner layer and the first metal layer, wherein the entire diffusion barrier layer is located under the dielectric barrier layer.

2. The interconnect structure of claim 1, wherein the diffusion barrier layer is a copper diffusion barrier layer.

3. The interconnect structure of claim 2, wherein the diffusion barrier layer is selected from the group consisting of: cobalt tungsten phosphide (CoWP), cobalt tungsten-boride (CoWB) and Ruthenium (Ru).

4. The interconnect structure of claim 1, wherein a portion of the second liner layer is located under the dielectric barrier layer.

5. The interconnect structure of claim 1, wherein the second liner layer is selected from the group consisting of: tantalum (Ta), tantalum nitride (TaN) and Ruthenium (Ru).

6. The interconnect structure of claim 1, further comprising an at least partially filled trench, wherein the trench is at least partially filled with a portion of the second liner layer and a portion of the second metal layer located over the portion of the second liner layer.

* * * * *